(12) United States Patent
Muramatsu et al.

(10) Patent No.: US 8,387,241 B2
(45) Date of Patent: Mar. 5, 2013

(54) METHOD OF FABRICATING WIRING BOARD

(75) Inventors: Masaki Muramatsu, Nagoya (JP); Kenji Nishio, Komaki (JP); Kazunaga Higo, Inuyama (JP); Hironori Sato, Kasugai (JP); Takuya Torii, Komaki (JP); Masao Izumi, Konan (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 19 days.

(21) Appl. No.: 13/025,557

(22) Filed: Feb. 11, 2011

(65) Prior Publication Data
US 2011/0232085 A1 Sep. 29, 2011

(30) Foreign Application Priority Data

Mar. 24, 2010 (JP) .................................. 2010-068104
Nov. 11, 2010 (JP) .................................. 2010-252691

(51) Int. Cl.
*H01K 3/10* (2006.01)
(52) U.S. Cl. .............. 29/852; 29/825; 29/846; 427/97.7
(58) Field of Classification Search .................... 29/825, 29/846, 852, 830; 427/97.7
See application file for complete search history.

(56) References Cited

U.S. PATENT DOCUMENTS

| | | | |
|---|---|---|---|
| 6,370,768 B1 * | 4/2002 | Itabashi | ........................... 29/852 |
| 8,075,788 B2 | 12/2011 | Arai et al. | |
| 2006/0009026 A1 | 1/2006 | Sawaguchi et al. | |
| 2008/0283491 A1 | 11/2008 | Arai et al. | |

FOREIGN PATENT DOCUMENTS

| | | |
|---|---|---|
| JP | 2006-49804 | 2/2006 |
| JP | 4127448 | 5/2008 |
| KR | 10-2008-0052432 A | 6/2008 |

OTHER PUBLICATIONS

Office Action mailed Nov. 7, 2012 in corresponding Korean Patent Application No. 10-2011-0026410 (See: Concise Statement of the Relevance of the Office Action Dated Nov. 7, 2012 in Corresponding Korean Application No. 10-2011-0026410, submitted herewith).

* cited by examiner

*Primary Examiner* — Carl Arbes
(74) *Attorney, Agent, or Firm* — Stites & Harbison PLLC; Jeffrey A. Haeberlin

(57) ABSTRACT

A method of fabricating a wiring board including at least one conductor layer and at least one resin insulating layer, the method including a wiring groove forming step of forming a wiring groove in the resin insulating layer by irradiating a surface of the resin insulating layer with a laser, and a wiring layer forming step of forming the conductor layer such that at least a portion of the conductor layer is embedded in the wiring groove to form a wiring layer in the wiring groove.

7 Claims, 10 Drawing Sheets

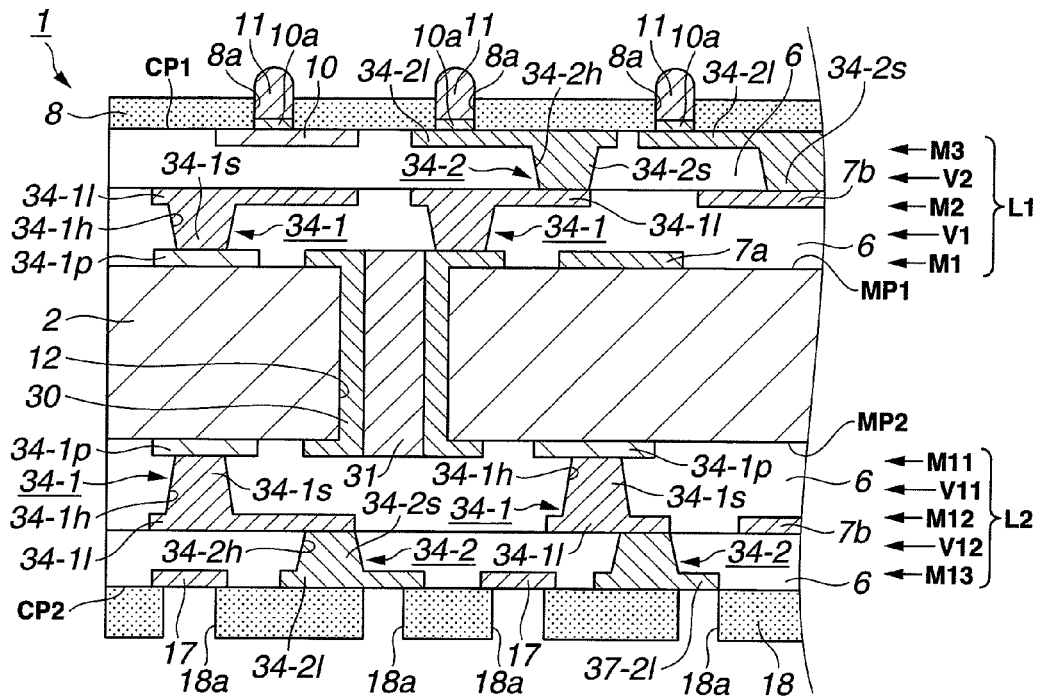
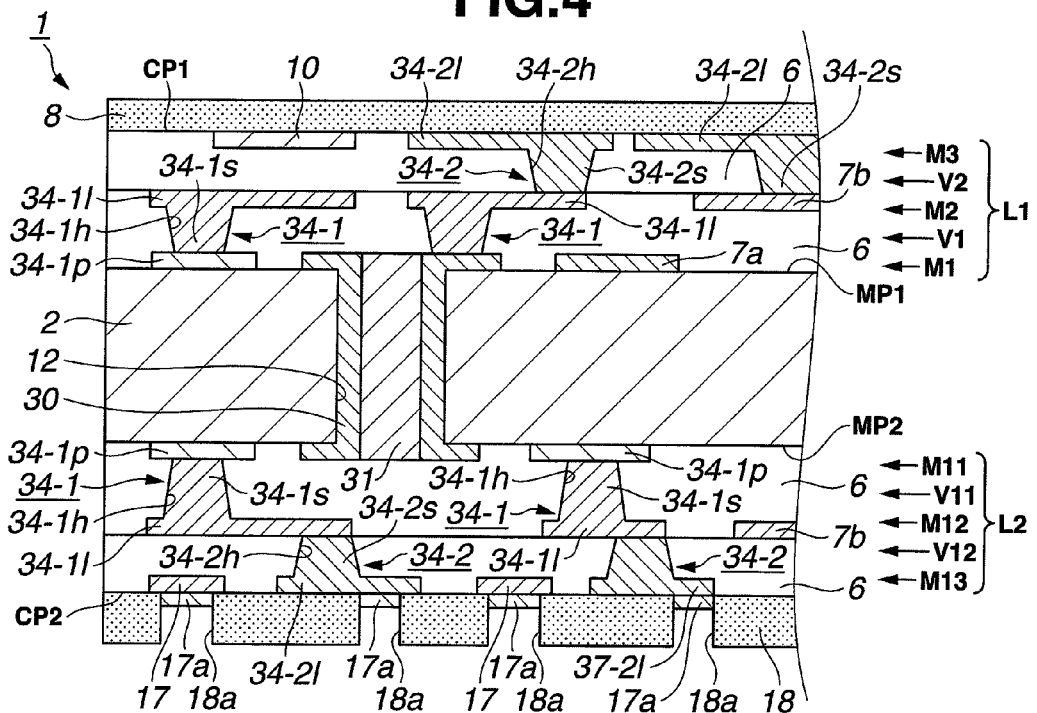

METHOD OF FABRICATING WIRING BOARD

BACKGROUND OF THE INVENTION

The present invention relates to a method of fabricating a wiring board.

In recent years, the tendency toward increasing the number of wiring layers and promotion of a fine structure thereof has proceeded owing to the increasing integration and speed of LSIs. Particularly, in order to realize enhancement of transistor characteristics in logic devices, it is essential to reduce a minimum pitch of wiring in accordance with the gate length. Accordingly, the technology of forming fine wiring becomes essential.

As such a technology of forming fine wiring, a damascene process in which an etching process is not needed has been replaced with the conventional dry etching process used in Al wiring technology and becomes mainstream. The damascene process is classified into a single damascene process and a dual damascene process.

In the single damascene process, a groove in which wiring is to be formed is formed in an interlayer insulating film by etching. A barrier metal layer as a diffusion prevention layer is deposited on the interlayer insulating film, and then a Cu film is deposited on the barrier metal layer. Subsequently, the Cu film and the barrier metal layer which are disposed in an upper portion of the groove are removed by chemical mechanical polishing (CMP) or the like and planarization is performed to thereby form the wiring. In contrast, in the dual damascene process, via holes through which electrical contact between upper and lower wiring layers is made are formed simultaneously with the wiring groove. The wiring and via plugs are simultaneously formed by performing deposition of a barrier metal layer, deposition of a Cu film and CMP one time for each. These steps are repeatedly carried out until a necessary number of layers are obtained. As a result, multilayered wiring can be formed.

As explained above, in the damascene process, in any of these two damascene processes (the single and dual damascene processes), it is necessary to form the wiring groove. Conventionally, for instance, as disclosed in Japanese Patent Application Unexamined Publication No. 2006-49804, spot processing is conducted by spot irradiation with a laser such as a carbon dioxide laser and a YAG laser, and the spot processing is repeatedly carried out a plurality of times to thereby form the above-described wiring groove.

Japanese Patent No. 4127448 discloses a method of fabricating a wiring board. In this method, an opening is formed in an outermost resist layer on an upper surface side of the wiring board by surface irradiation with an excimer laser, and a larger diameter opening is formed in a resist layer on a lower surface side of the wiring board by irradiation with a carbon dioxide gas laser, so that an exposed area of a metal terminal pad disposed on the lower surface side of the wiring board is increased to thereby establish good connection between the wiring board and an external connecting terminal of another wiring board or the like.

SUMMARY OF THE INVENTION

However, in such spot processing as described in Japanese Patent Application Unexamined Publication No. 2006-49804, it is difficult to perform processing of linear portions and curved portions of the wiring groove. Therefore, there are problems such as variation in shape of edge portions processed and variation in depth of the wiring groove due to multiple irradiation with a laser upon carrying out the spot processing a plurality of times. Consequently, variation in shape or thickness of the Cu wiring formed in the wiring groove occurs to thereby cause deviation in impedance of the Cu wiring to be formed in the wiring board from the design value and lead to deterioration in fabricating yield of the wiring board.

In addition, the surface irradiation with the laser in Japanese Patent No. 4127448 relates to formation of an opening in the outermost resist layer which aims at connecting the wiring board with an external connecting terminal of another wiring board. Further, Japanese Patent No. 4127448 is based on the premise that the wiring board is fabricated by a so-called semi-additive process (SAP), and neither refers to nor suggests fabrication of the wiring board by the damascene process. Accordingly, it is clearly understood that this conventional art does not take into consideration at all the variation in shape of the edge portion processed or the variation in depth of the wiring groove which is caused by multiple irradiation with a laser upon carrying out the spot processing a plurality of times as described above. Consequently, in this conventional art, there is no motivation for applying the technology of this conventional art to the present invention.

It is an object of the present invention to provide a method of fabricating a wiring board having at least one conductor layer and at least one resin insulating layer by a so-called damascene process, in which when a wiring groove is formed in the resin insulating layer and a conductor layer as a wiring layer is formed in the wiring groove, occurrence of variation in processing shape and processing depth of the wiring groove can be suppressed to thereby prevent occurrence of variation in shape and thickness of the wiring layer to be formed in the wiring groove so that the wiring layer having a design value of impedance can be obtained and the fabricating yield of the wiring board can be enhanced.

In a first aspect of the present invention, there is provided a method of fabricating a wiring board including at least one conductor layer and at least one resin insulating layer, the method including:

a wiring groove forming step of forming a wiring groove in the resin insulating layer by irradiating a surface of the resin insulating layer with a laser; and a wiring layer forming step of forming the conductor layer such that at least a portion of the conductor layer is embedded in the wiring groove to form a wiring layer in the wiring groove.

In the method of fabricating a wiring board according to the first aspect of the present invention, the wiring groove in which the wiring layer as a portion of the conductor layer is to be formed is formed in the resin insulating layer by irradiating the surface of the resin insulating layer with a laser using a pattern corresponding to a shape of the wiring groove (that is, by surface irradiation with a laser).

Consequently, the wiring grove is formed in the resin insulating layer not by spot processing but by surface processing. Therefore, there does not occur such a problem that variation in depth of the wiring groove is caused by multiple irradiation with a laser upon repeatedly carrying out the spot processing a plurality of times. As a result, it is possible to suppress occurrence of variation in shape and thickness of the wiring layer formed in the wiring groove and deviation in impedance of the wiring to be formed in the wiring board from a design value which leads to deterioration in fabricating yield of the wiring board.

In a further aspect of the present invention, there is provided the method of fabricating a wiring board, wherein in the step of forming a wiring groove, the wiring groove can be formed so as not to completely penetrate the resin insulating layer. In this method, it is possible to obtain the configuration in which the wiring to be formed can be electrically insulated from the lower wiring layer and the like and can be embedded in the resin insulating layer. Therefore, even in a case where fine wiring is formed, the fine wiring can be prevented from falling off from the wiring board.

Further, in a still further aspect of the present invention, there is provided the method of fabricating a wiring board which further includes the step of forming a through hole in the resin insulating layer by irradiating the resin insulating layer with a carbon oxide gas laser or a UV laser, and the step of forming a via conductor in the through hole. In this method, formation of the via conductor to establish electrical connection with the lower wiring layer as well as the above-described formation of the wiring in the wiring groove can be performed. That is, the formation of the via conductor and the formation of the wiring in the wiring groove can be performed using a method similar to the dual damascene process.

Further, in a still further aspect of the present invention, there is provided the method of fabricating a wiring board, wherein the step of forming the wiring groove can be carried out after completion of the step of forming the through-hole, and the step of forming the wiring and the step of forming the via conductor can be simultaneously performed after completion of the step of forming the wiring groove. In this method, the formation of the wiring and the formation of forming the via conductor can be carried out at the same time. In this method, the wiring board is fabricated using the so-called dual damascene process. On the other hand, the step of forming the wiring groove is performed after completion of the step of forming the through-hole. Therefore, a residue of the resin insulating layer which remains at a bottom of the through-hole upon completion of forming the through-hole in the resin insulating layer can be removed by carrying out surface irradiation with a laser, so that the inside of the through-hole is cleaned up.

BRIEF DESCRIPTION OF THE DRAWINGS

FIG. 3 is an enlarged sectional view of a part of the wiring board shown in FIG. 1 and FIG. 2, taken along line I-I shown in FIG. 1 and FIG. 2.

FIG. 4 is an enlarged sectional view of a part of the wiring board shown in FIG. 1 and FIG. 2, taken along line II-II shown in FIG. 1 and FIG. 2.

DETAILED DESCRIPTION OF THE INVENTION

In the following, an embodiment of the present invention is explained by referring to the accompanying drawings.

[Wiring Board]

First, a structure of the wiring board fabricated by the method according to the embodiment of the present invention is explained. The wiring board as explained hereinafter is merely an example and not limited to the specific one as long as the wiring board includes at least one conductor layer and at least one resin insulating layer.

Figure 1:
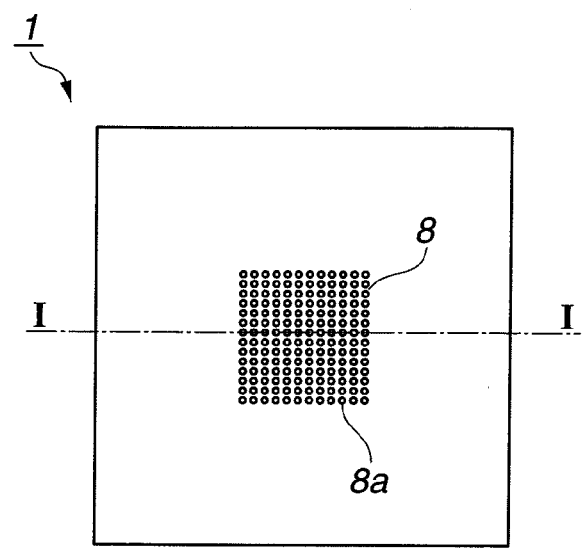
FIG. 1 is a plan view of a wiring board according to an embodiment of the present invention when viewed from an upper side of the wiring board.
Figure 2:
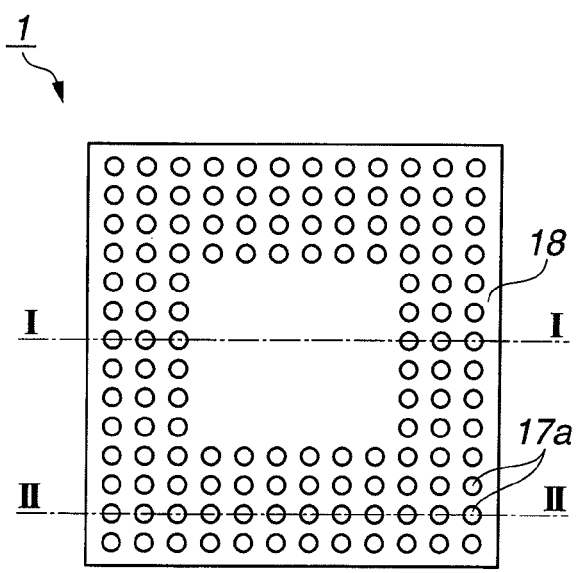
FIG. 2 is a plan view of the wiring board according to the embodiment of the present invention when viewed from a lower side of the wiring board.

FIG. 1 and FIG. 2 show plan views of the wiring board according to the embodiment. FIG. 1 is a plan view of the wiring board according to the embodiment when viewed from an upper side thereof. FIG. 2 is a plan view of the wiring board according to the embodiment when viewed from a lower side thereof. FIG. 3 shows an enlarged section of a part of the wiring board shown in FIG. 1 and FIG. 2, taken along line I-I. FIG. 4 shows an enlarged section of a part of the wiring board shown in FIG. 1 and FIG. 2, taken along line II-II.

As shown in FIG. 1 to FIG. 4, a wiring board 1 includes a plate-shaped core 2 and core conductor layers M1, M11 (also referred to simply as conductor layers) respectively formed on opposite surfaces (first and second main surfaces MP1, MP2 as explained later) of the plate-shaped core 2. The plate-shaped core 2 may be provided in the form of a heat-resistant resin plate (for instance, bismaleimide-triazine resin plate), a fiber reinforced resin plate (for instance, glass fiber reinforced epoxy resin plate) or the like. The core conductor layers M1, M11 form metal wiring layers 7a having predetermined patterns, respectively. The core conductor layers M1, M11 are respectively formed as a surface conductor pattern to cover almost an entire portion of the respective surfaces of the plate-shaped core 2, and are used as a power supply layer or a grounding layer.

On the other hand, as shown in FIG. 3 and FIG. 4, the plate-shaped core 2 is provided with a through hole 12 formed by drilling or the like. Formed in an inner circumferential wall surface which defines the through hole 12 of the core 2 is a through-hole conductor 30 which electrically connects the core conductor layers M1, M11 with each other. The through hole 12 is filled with a resin filler 31 made of such as an epoxy resin.

First via layers (build-up layers: insulating layers) V1, V11 are formed on an outer surface of the core conductor layers M1, M11, respectively. The first via layers V1, V11 are made of a thermosetting resin composition 6 which may contain a silica filler, if necessary. On outer surfaces of the first via layers V1, V11, first conductive layers M2, M12 are formed by Cu plating to be embedded in the first via layers V1, V11, respectively. The first conductive layers M2, M12 form metal wiring layers 7b, respectively. Meanwhile, the outer surfaces of the first via layers V1, V11 are flush with the outer surfaces of the metal wiring layers 7b so that the outer surfaces of the metal wiring layers 7b are exposed outside on the outer surfaces of the first via layers V1, V11.

Second via layers (build-up layers: insulating layers) V2, V12 are formed on the outer surfaces of the first via layers V1, V11 and the outer surfaces of the first conductive layers M2, M12, respectively. The second via layers V2, V12 are made of a thermosetting resin composition 6.

Further, on outer surfaces of the second via layers V2, V12, second conductor layers M3, M13 are formed by Cu plating. The second conductor layers M3, M13 have metal terminal pads 10, 17, respectively.

Interlayer connection between the respective core conductor layers M1, M11 and the respective first conductor layers M2, M12 is established through filled vias 34-1 owing to a fabricating method as explained later. The vias 34-1 each include a via hole 34-1h, a via conductor 34-1s formed so as to fill the via hole 34-1h, a via pad 34-1p disposed on a bottom side of the via conductor 34-1s (that is, on the side of the core conductor layers M1, M11), and a via land 34-1l disposed on an opposite side of the via pad 34-1p. The via pad 34-1p is formed so as to be electrically connected with the via conductor 34-1s. The via land 34-1l extends from an outer periphery of a top side of the via conductor 34-1s in a radially outward direction of the via hole 34-1h.

The via 34-1 is embedded in the respective first via layers V1, V11. Meanwhile, an outer surface of the via land 34-1l is flush with the outer surface of the respective first via layers V1, V11 so that the outer surface of the via land 34-1l is exposed outside on the outer surface of the respective first via layers V1, V11.

Interlayer connection between the respective first conductor layers M2, M12 and the respective second conductor layers M3, M13 is established through filled vias 34-2 owing to the fabricating method as explained later. The vias 34-2 each include a via hole 34-2h, a via conductor 34-2s filling the via hole 34-2h, and a via land 34-2l extending from an outer periphery of the via conductor 34-2s in a radially outward direction of the via hole 34-2h. The via conductor 34-2s is electrically connected with the via land 34-1l of the via 34-1 and the metal wiring layer 7b.

As described above, the core conductor layer M1, the first via layer V1, the first conductor layer M2, the second via layer V2 and the second conductor layer M3 are successively laminated in this order on a first main surface MP1 of the plate-shaped core 2 and constitute a first wiring laminated portion L1. Further, the core conductor layer M11, the first via layer V11, the first conductor layer M12, the second via layer V12 and the second conductor layer M13 are successively laminated in this order on a second main surface MP2 of the plate-shaped core 2 and constitute a second wiring laminated portion L2. The first wiring laminated portion L1 has a first main surface CP1 on which a plurality of metal terminal pads 10 are formed. The second wiring laminated portion L2 has a second main surface CP2 on which a plurality of metal terminal pads 17 are formed.

As shown in FIG. 3, on the first main surface CP1, a solder resist layer 8 having openings 8a is formed. On the metal terminal pad 10 and the via land 34-2l which are exposed to the openings 8a, a laminated film 10a containing nickel and gold is formed by electroless plating. As shown in FIG. 4, on the second main surface CP2, a solder resist layer 18 having openings 18a is formed. On the metal terminal pad 17 and the via land 34-2l which are exposed to the openings 18a, a laminated film 17a containing nickel and gold is formed by electroless plating. Meanwhile, the laminated film 17a can be omitted and the metal terminal pad 17 and the via land 34-2l can be directly exposed to the openings 18a.

In the respective openings 8a, a solder bump 11 made of a solder substantially free of Pb, for instance, Sn—Ag, Sn—Cu, Sn—AG—Cu, Sn—Sb, etc. is formed so as to be electrically connected with the metal pad 10 and the via land 34-2l. Further, in the respective openings 18a, a solder ball or pin (not shown) is formed so as to be electrically connected with the metal pad 17 and the via land 34-2l.

As seen from FIG. 1 to FIG. 4, the wiring board 1 according to the embodiment has a generally rectangular plate shape. For instance, a size of the wiring board 1 may be about 35 mm×about 35 mm×about 1 mm.

(Method of Fabricating Wiring Board)

Referring to FIG. 5 to FIG. 16, the method of fabricating the wiring board 1 as shown in FIG. 1 to FIG. 4 is explained. FIG. 5 to FIG. 16 show the steps of the fabricating method according to the embodiment when viewed in section corresponding to FIG. 3 taken along line I-I shown in FIG. 1.

Figure 5:
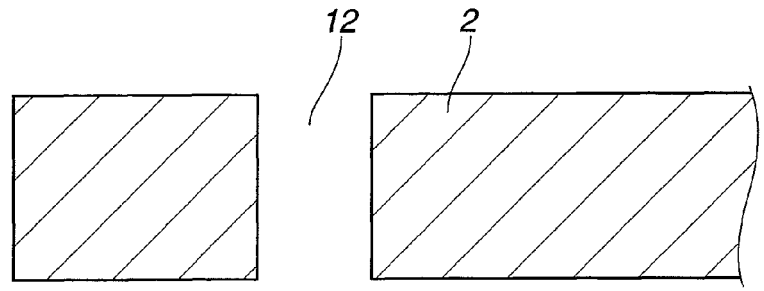
FIG. 5 is a diagram showing a step of a method of fabricating the wiring board according to the embodiment.
Figure 6:
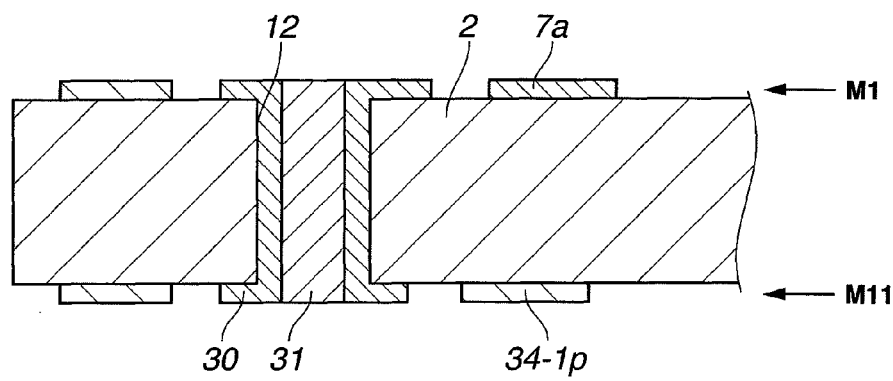
FIG. 6 is a diagram showing a step of the method of fabricating the wiring board according to the embodiment.

First, as shown in FIG. 5, a heat-resistant resin plate (for instance, bismaleimide-triazine resin plate) or a fiber reinforced resin plate (for instance, glass fiber reinforced epoxy resin plate) is prepared as the core 2 and the through hole 12 is formed by a suitable method such as drilling. Next, as shown in FIG. 6, the core conductor layers M1, M11 and the through-hole conductor 30 are formed by pattern plating and a resin filler 31 is filled in the through hole 12.

Figure 7:
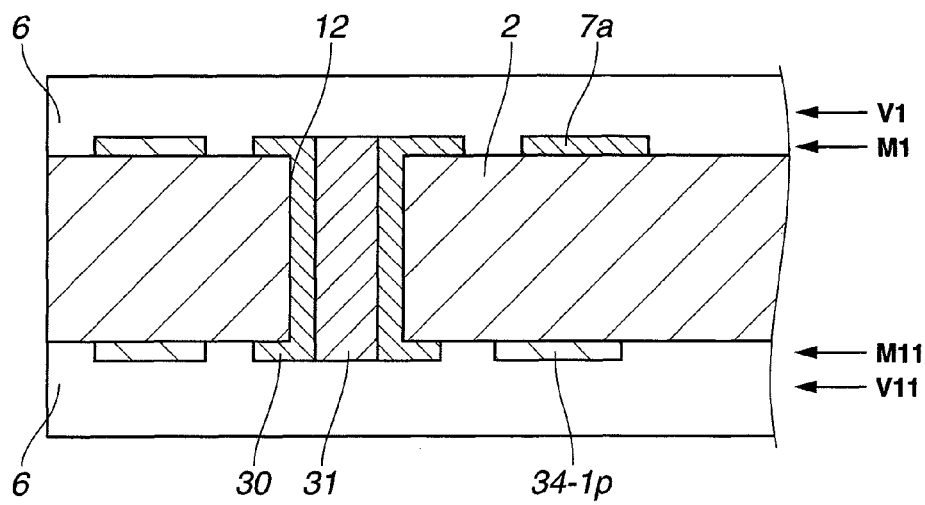
FIG. 7 is a diagram showing a step of the method of fabricating the wiring board according to the embodiment.

Next, surfaces of the core conductor layers M1, M11 are subjected to roughening treatment, respectively. Subsequently, as shown in FIG. 7, resin films 6 are laminated to cover the surfaces of the core conductor layers M1, M11 and subjected to curing to thereby obtain the insulating layers V1, V11. The resin films may contain a filler if necessary.

Figure 8:
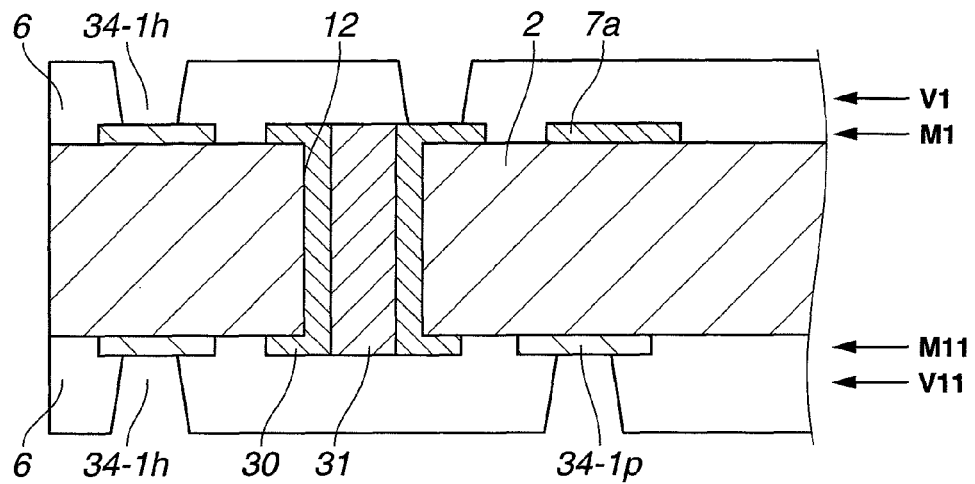
FIG. 8 is a diagram showing a step of the method of fabricating the wiring board according to the embodiment.

Next, as shown in FIG. 8, through holes (i.e., the via holes) 34-1h are formed in the respective insulating layers (i.e., the via layers) V1, V11 by irradiating the respective insulating layers V1, V11 with a carbon dioxide gas laser or a UV laser from the side of the main surface thereof in a predetermined pattern. The insulating layers V1, V11 including the via holes 34-1h are then subjected to roughening treatment. Intensity (power) of the carbon dioxide gas laser or the UV laser to be irradiated may be within the range of 10 W to 200 W. In a case where the respective insulating layers V1, V11 containing a filler are subjected to the roughening treatment after the laser irradiation as described above, the filler tends to be librated and remain on the surface of the respective insulating layers V1, V11. For this reason, in such a case, the insulating layers V1, V11 may be appropriately rinsed with high pressure water to thereby remove the filler librated.

Next, the insulating layers V1, V11 are subjected to desmear process and outline etching to clean an inner circumferential surface of the respective via holes 34-1h. In this embodiment, since water rinsing is carried out in the desmear process, aggregation of the filler librated can be suppressed upon the water rinsing in the desmear process.

In addition, in this embodiment, air blowing may be carried out between the high-pressure water rinsing and the desmear process. As a result, even when the filler librated is not completely removed by the high-pressure water rinsing, removal of the filler can be complemented by the air blowing.

Figure 9:
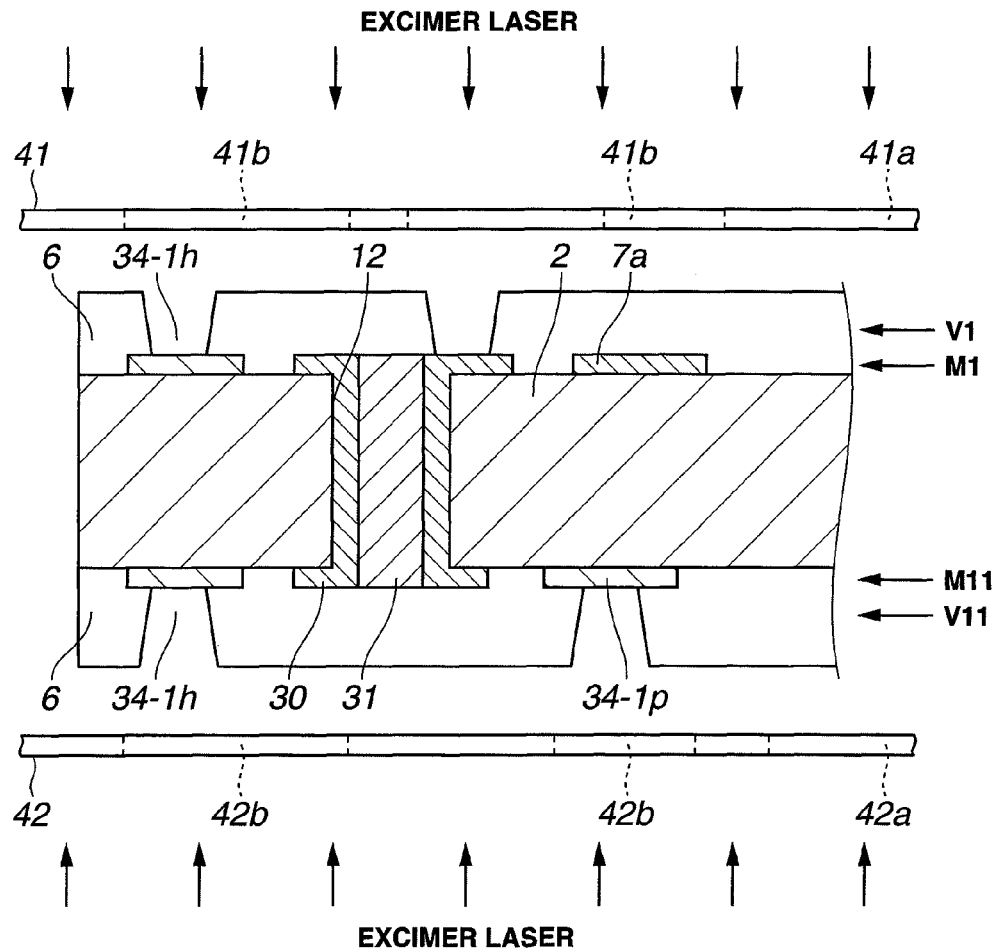
FIG. 9 is a diagram showing a step of the method of fabricating the wiring board according to the embodiment.
Figure 10:
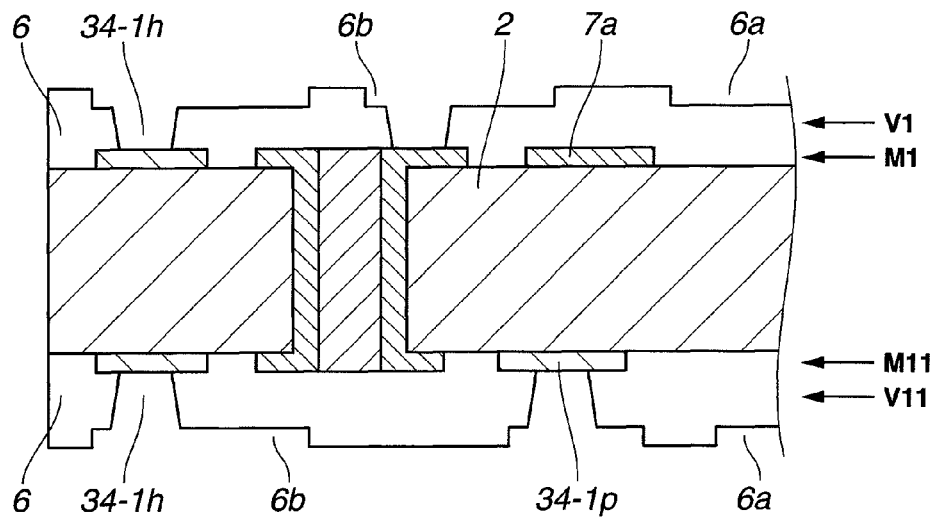
FIG. 10 is a diagram showing a step of the method of fabricating the wiring board according to the embodiment.

Subsequently, as shown in FIG. 9, a first mask 41 having openings 41a, 41b is disposed over the main surface of the insulating layer V1 and a second mask 42 having openings 42a, 42b is disposed over the main surface of the insulating layer V11. The opening 41a of the first mask 41 and the opening 42a of the second mask 42 are configured to correspond to a shape of respective wiring grooves 6a for the metal wiring layers 7b which are to be formed in the insulating layers V1, V11. The opening 41b of the first mask 41 and the opening 42b of the second mask 42 are configured to correspond to a shape of grooves 6b for the via lands 34-1l (hereinafter referred to as via land grooves 6b) which are to be formed in the insulating layers V1, V11. Subsequently, the main surfaces of the insulating layers V1, V11 are irradiated with an excimer laser through the first and second masks 41, 42, respectively. That is, the main surfaces of the insulating layers V1, V11 are subjected to surface irradiation with the excimer laser through the first and second masks 41, 42, respectively. As a result, as shown in FIG. 10, the wiring grooves 6a are formed in positions on the main surfaces of the insulating layers. V1, V11 which correspond to the opening 41a of the first mask 41 and the opening 42a of the second mask 42. Also, the via land grooves 6b are formed in positions on the main surfaces of the insulating layers V1, V11 which correspond to the opening 41b of the first mask 41 and the opening 42b of the second mask 42. The via land grooves 6b extend to communicate with the via holes 34-1h in the insulating layers V1, V11.

An intensity (power) of the excimer laser to be used for the surface irradiation may be, for instance, within the range from 10 W to 200 W. Further, the laser to be used for the surface irradiation is not limited to the excimer laser, and a YAG laser, a $CO_2$ laser and the like may also be used therefor.

The wiring grooves 6a and the via land grooves 6b are formed at one time by carrying out the surface irradiation with the excimer laser. Therefore, the surface irradiation is free from problems which are caused upon carrying out spot irradiation with the excimer laser. The problems include variation in shape of processed edge portions which is caused upon spot processing, variation in depth of the wiring groove 6a and the via land groove 6b which is caused by multiple irradiation with the excimer laser upon carrying out spot processing a plurality of times, and the like. Consequently, it is possible to suppress occurrence of variation in shape and thickness of the metal wiring layers 7b which is formed in the wiring grooves 6a and the via lands 34-1l which is formed in the via land grooves 6b. Particularly, it is possible to prevent impedance of the metal wiring layer 7b from deviating from a design value and suppress deterioration in fabricating yield of the wiring board 1.

Meanwhile, in a case where the wiring board 1 to be fabricated has a relatively large size and a large number of the wiring grooves 6a and the via land grooves 6b must be formed on the wiring board 1, the wiring grooves 6a and the via land grooves 6b can be formed in predetermined positions on the main surfaces of the insulating layers V1, V11 by appropriately displacing the excimer laser, the first mask 41 and the second mask 42 to the predetermined positions on the main surfaces of the insulating layers V1, V11.

In addition, the wiring groove 6a and the via land groove 6b are formed so as not to penetrate the insulating layers V1, V11.

In this embodiment, after the via holes 34-1h are formed by irradiating the insulating layers V1, V11 with the carbon dioxide gas laser or the UV laser, the surface irradiation with the excimer laser is carried out to thereby form the wiring grooves 6a and the via land grooves 6b. At this time, even a bottom of the respective via holes 34-1h is irradiated with the excimer laser. As a result, the residue of the insulating layers V1, V11 which remains librated at the bottom of the respective via holes 34-1h upon completion of forming the respective via holes 34-1h can be removed by the surface irradiation with the excimer laser so that the inside of the respective via holes 34-1h is cleaned up. Accordingly, the water rinsing in the desmear process and the following air blowing may be omitted.

Figure 11:
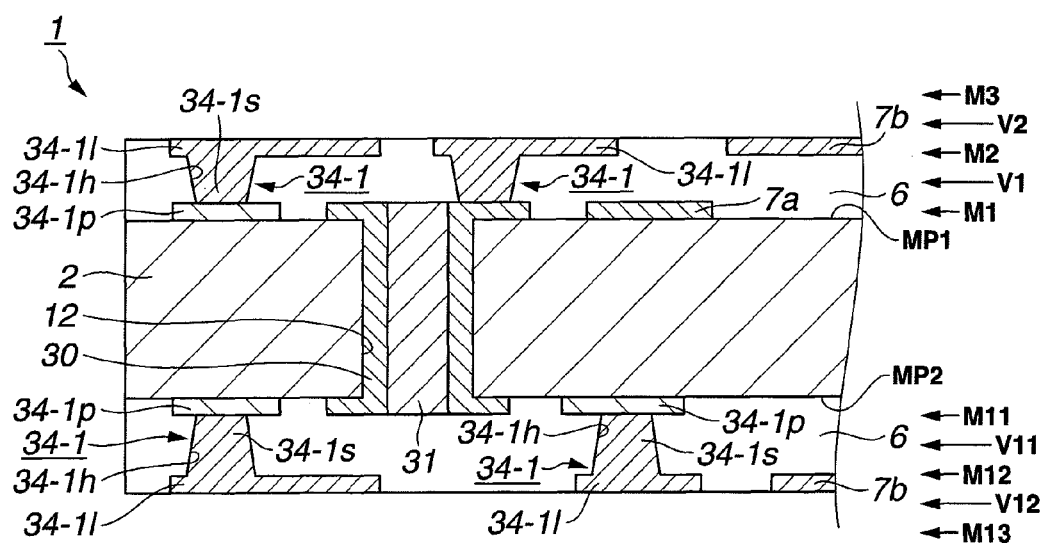
FIG. 11 is a diagram showing a step of the method of fabricating the wiring board according to the embodiment.

Subsequent to the step of forming the wiring grooves 6a and the via land grooves 6b by carrying out the surface irradiation with the excimer laser, a plated undercoating is formed in the wiring grooves 6a, the via land grooves 6b and the via holes 34-1h by electroless Cu plating, and then electroplating is carried out to form a Cu coating. After that, a surplus of the electroplated Cu coating which lies outside the wiring grooves 6a, the via land grooves 6b and the via holes 34-1h is removed by etching. As a result, as shown in FIG. 11, the metal wiring layers 7b are formed in the wiring grooves 6a, and at the same time, the via conductors 34-1s are formed to fill the via holes 34-1h and the via lands 34-1l are formed in the via land grooves 6b.

Thus, the conductor layers M2, M12 patterned can be obtained. In this case, since the wiring grooves 6a and the via land grooves 6b are formed so as not to penetrate the insulating layers V1, V11, the metal wiring layers 7b can be formed in such a state as to be electrically insulated from the core conductor layers M1, M11 and be embedded in the insulating layers V1, V11. Accordingly, even in a case where the metal wiring layers 7b are formed in a fine pattern, the metal wiring layers 7b can be prevented from falling off from the wiring board 1.

Figure 12:
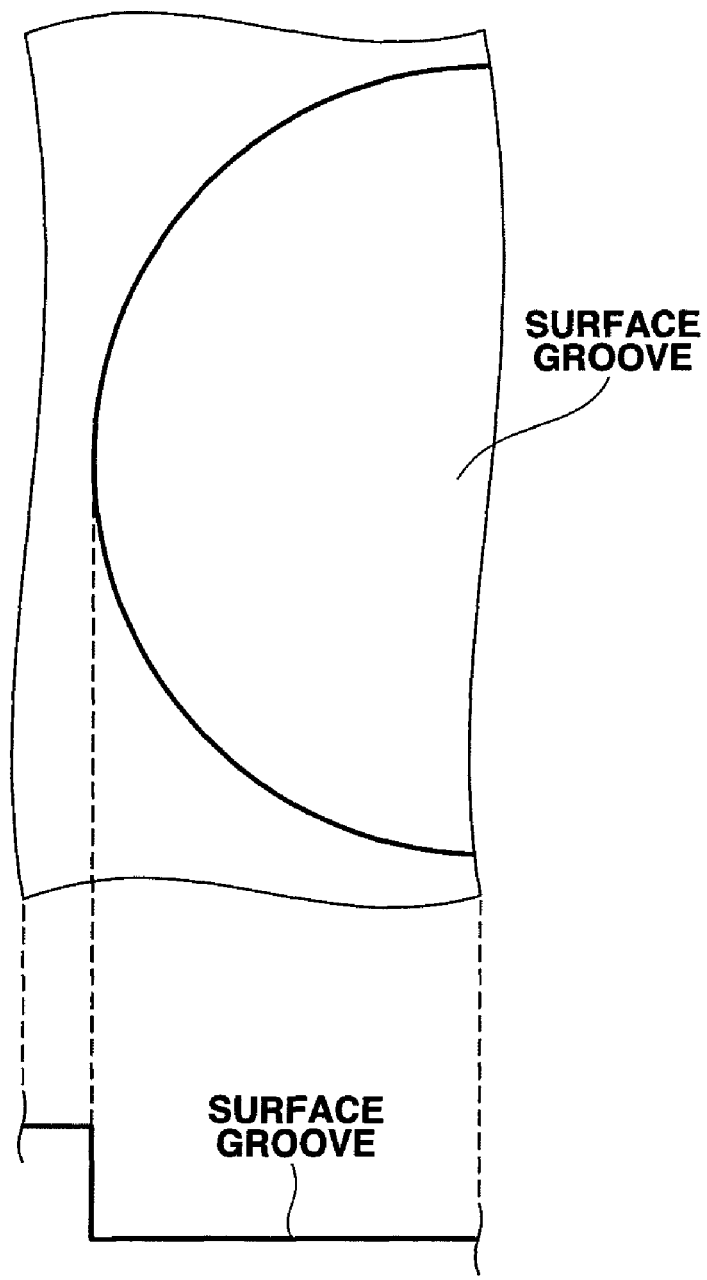
FIG. 12 is a diagram showing a surface groove processed by surface irradiation with an excimer laser in the embodiment.
Figure 13:
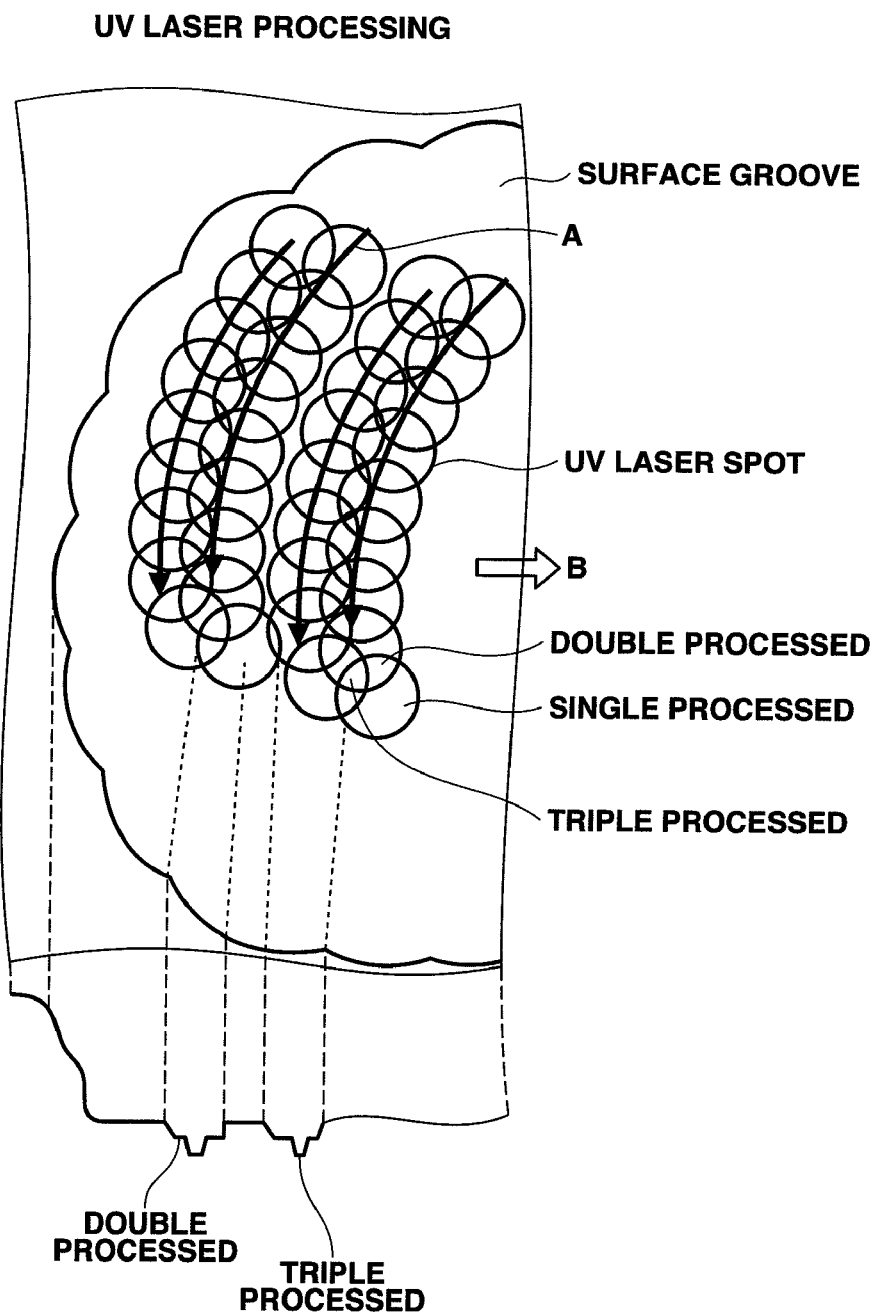
FIG. 13 is a diagram showing a surface groove processed by spot irradiation with a UV laser in the embodiment.

FIG. 12 is a diagram showing a surface groove formed (or processed) by carrying out surface irradiation with an excimer laser. FIG. 13 is a diagram showing a surface groove formed (or processed) by carrying out spot irradiation with a UV laser. In FIG. 12 and FIG. 13, an upper part of the respective diagrams is a plan view of the surface groove, and a lower part thereof is a sectional view of the surface groove. As shown in FIG. 12, the surface groove formed by carrying out the surface irradiation with the excimer laser according to this embodiment includes a flat bottom wall surface and a side wall surface which substantially perpendicularly extends from the bottom wall surface. As seen from FIG. 12, the processed surface (i.e., the bottom wall surface and the side wall surface) on an inside of the surface groove are flat.

In contrast, as shown in FIG. 13, the surface groove formed by carrying out the spot irradiation with the UV laser includes a single-processed region, a double-processed region and a triple-processed region. Specifically, in the spot irradiation with the UV laser, scanning of the UV laser is carried out such that the adjacent spots are at least partially overlapped with each other along a circumferential direction of the surface groove to be formed, as indicated by arrow A in FIG. 13, and further the adjacent spots are at least partially overlapped with each other along an inward direction of the surface groove to be formed, as indicated by arrow B in FIG. 13. By being scanned with the UV laser in the directions as indicated by arrows A and B as shown in FIG. 13, there are provided a region irradiated with the UV laser without overlapping the adjacent spots with each other (i.e., the single-processed region), a region irradiated with the UV laser so as to overlap the adjacent two spots with each other (i.e., the double-processed region), and a region irradiated with the UV laser so as to overlap the adjacent three spots with one another (i.e., the triple-processed region).

In such a case, since the double-processed region and the triple-processed region undergo irradiation with the UV laser with the frequency larger than that in the single-processed region by once and twice, respectively. The extent of processing is varied in accordance with the frequency of irradiation with the UV laser so that a processing depth in the double-processed region becomes larger than that in the single-processed region, and a processing depth in the triple-processed region becomes larger than that in the double-processed region. Consequently, as shown in FIG. 13, three-step processed holes are formed in the processed surface groove in accordance with the above-described difference in processing depth between the single-processed region, the double-processed region and the triple-processed region, so that the processed surface has microscopic irregularities including recesses and projections.

In accordance with the three-step processing as described above, a wall surface of the processed surface groove includes three-stepped portion, i.e., a radially outermost portion formed by mainly carrying out the single processing, a radially outer portion located inside of the radially outermost position and formed by mainly carrying out the double processing, and a radially inner position located inside of the radially outer position and formed by the triple processing. Accordingly, the processing depth becomes larger in the radially inward direction of the processed surface groove, so that a uniform processing depth cannot be realized. As a result, the wall surface of the processed surface groove fails to have a perpendicularly extending flat surface to thereby form the steps in the inward direction of the processed surface groove due to the above-described difference in processing depth.

Consequently, in the groove processing using the spot irradiation with the UV laser as shown in FIG. 13, there occur problems such as variation in shape of the processed edge portions and variation in depth of the wiring grooves which is caused by multiple irradiation with the UV laser upon carrying out the spot processing a plurality of times.

Figure 14:
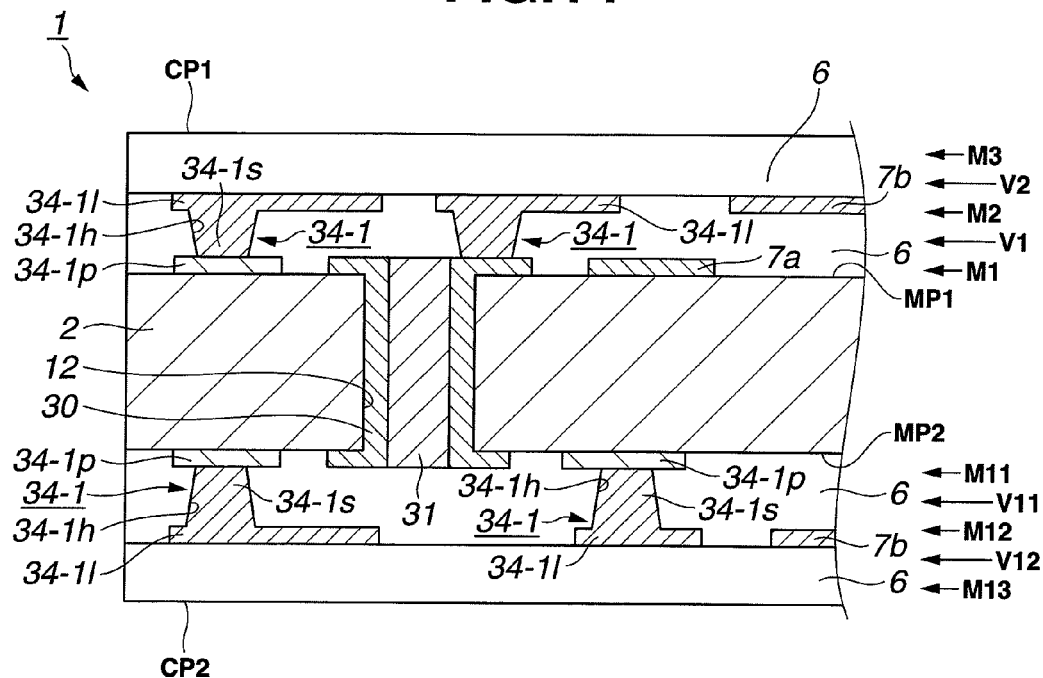
FIG. 14 is a diagram showing a step of the method of fabricating the wiring board according to the embodiment.

Subsequent to the step of forming the metal wiring layers 7b, the via conductors 34-1s and the via lands 34-1l as described above, the first conductor layers M2, M12 are subjected to roughening treatment. After that, as shown in FIG. 14, a resin film 6 is laminated on the roughened surface of the first conductor layers M2, M12 so as to cover the first conductor layers M2, M12, and then cured to thereby obtain the insulating layers V2, V12. The resin film 6 may contain a filler, if necessary, as described above.

Figure 15:
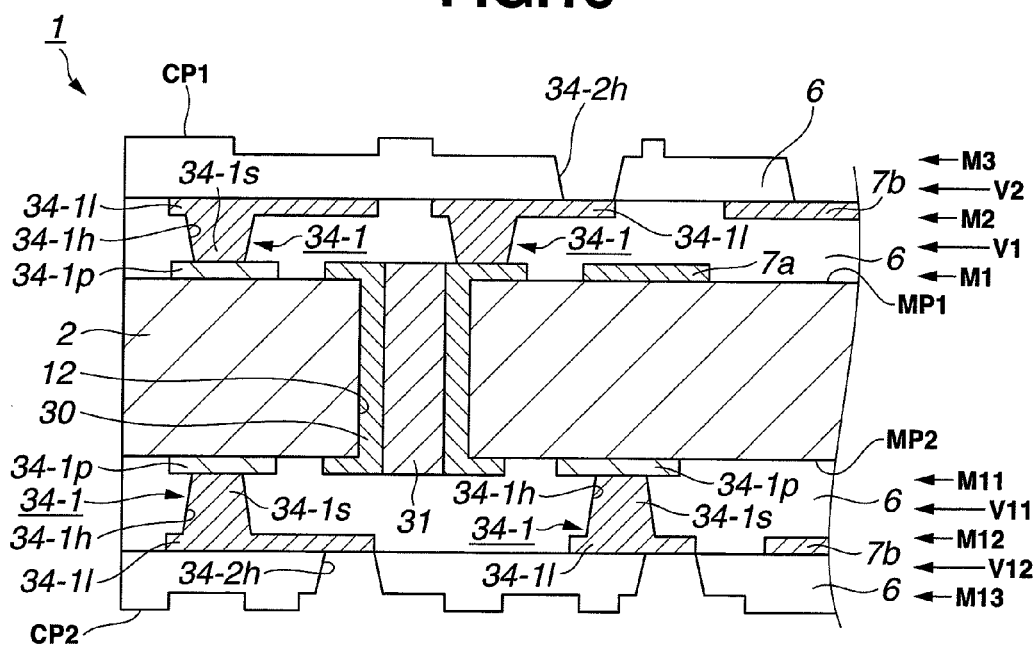
FIG. 15 is a diagram showing a step of the method of fabricating the wiring board according to the embodiment.

Next, as shown in FIG. 15, the via holes 34-2h are formed in the insulating layers (the via layers) V2, V12 in a predetermined pattern by carrying out laser irradiation from the side of the main surfaces CP1, CP2, and the insulating layers V2, V12 including the via holes 34-2h are then subjected to roughening treatment. In a case where the respective insulating layers V2, V12 contain a filler and are subjected to the roughening treatment after the laser irradiation as described above, the filler is librated and remains on the thus treated surface of the respective insulating layers V2, V12. For this reason, in such a case, the insulating layers V2, V12 are appropriately rinsed with high pressure water and then subjected to air blowing to remove the librated filler therefrom, similarly to the above-described insulating layers V1, V11. Subsequently, the insulating layers V2, V12 are subjected to desmear process and outline etching to clean an inner circumferential surface of the via holes 34-2h.

Figure 16:
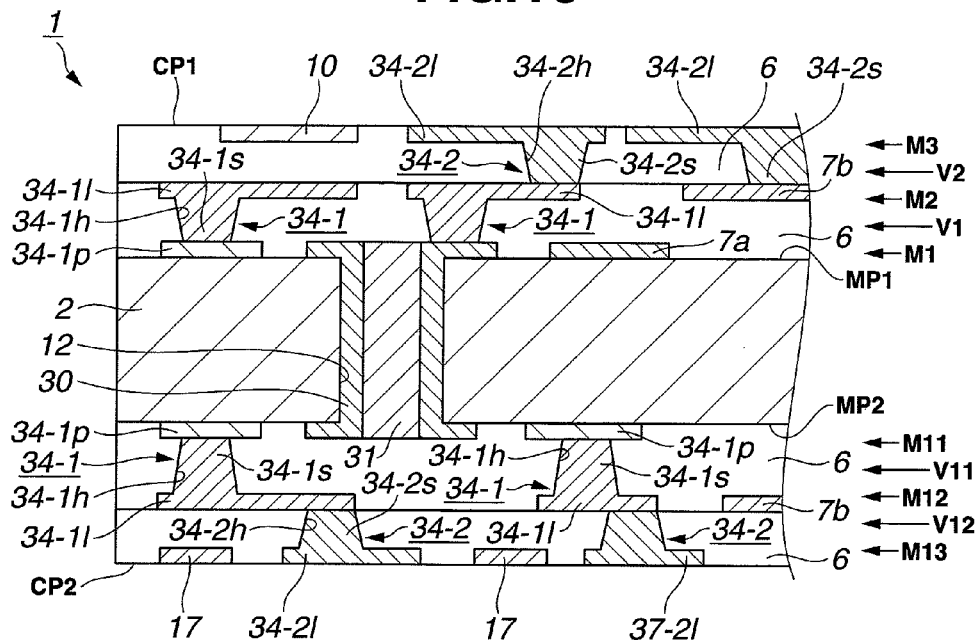
FIG. 16 is a diagram showing a step of the method of fabricating the wiring board according to the embodiment.

Next, as shown in FIG. 16, the via conductors 34-2s, the via lands 34-2l and the metal terminal pads 10, 17 are formed by the same method as described above by referring to FIG. 9 to FIG. 11. Thus, the second conductor layers M3, M13 patterned are obtained.

Figure 17:
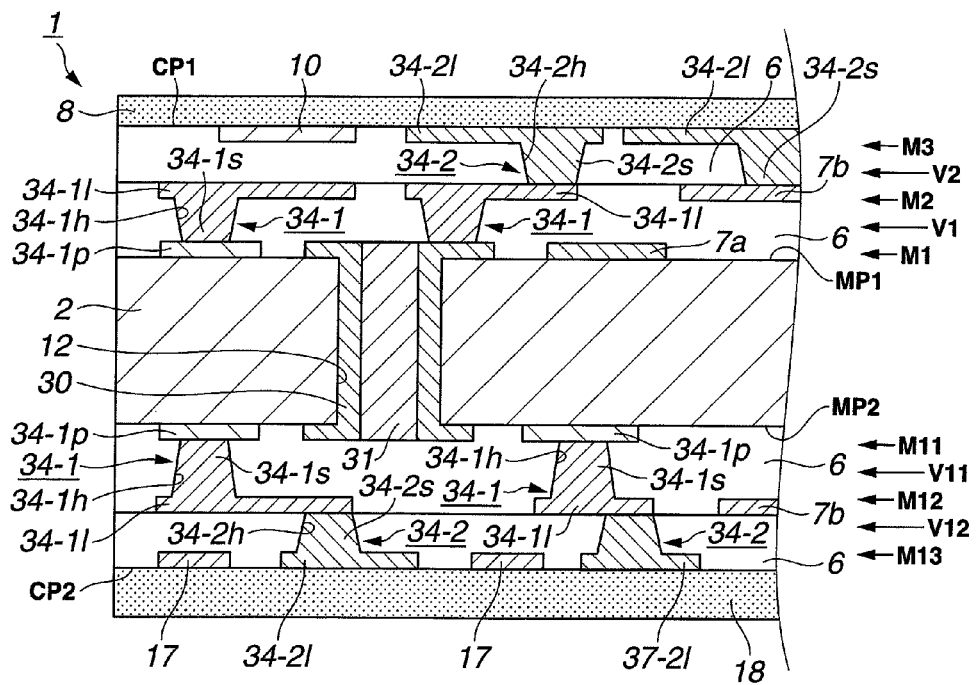
FIG. 17 is a diagram showing a step of the method of fabricating the wiring board according to the embodiment.
Figure 18:
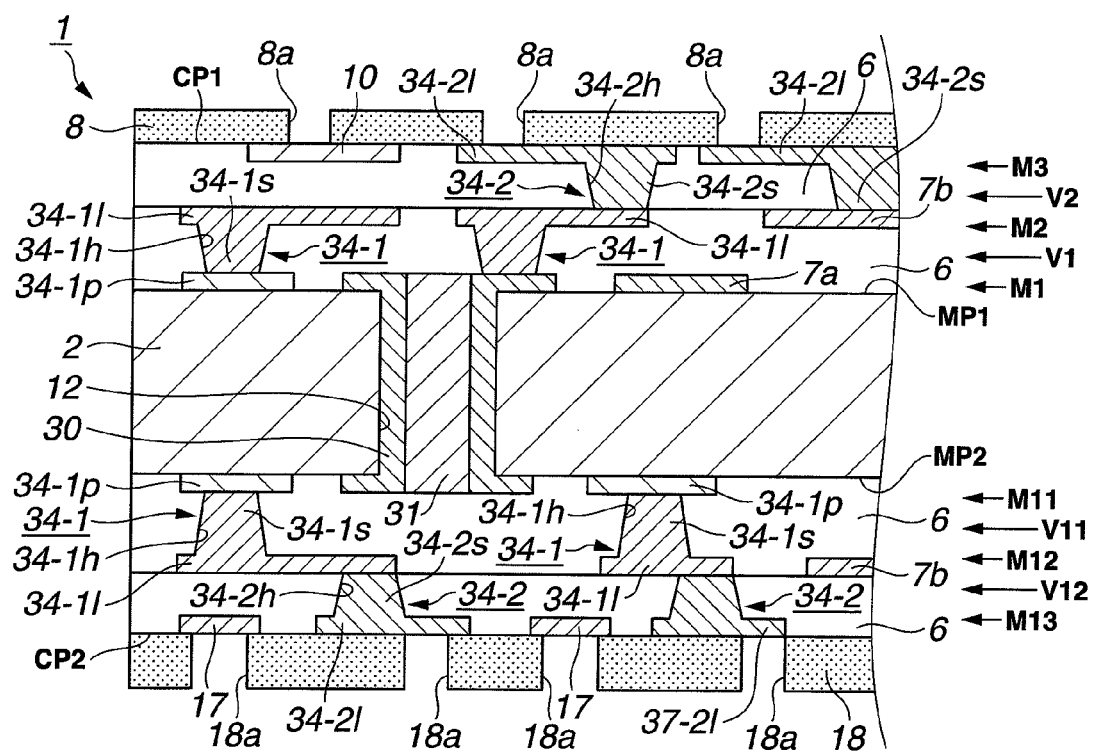
FIG. 18 is a diagram showing a step of the method of fabricating the wiring board according to the embodiment.

Subsequently, as shown in FIG. 17, the resist layers 8, 18 are formed on the second conductor layers M3, M13 by application of a resist thereon so as to fill the via holes 34-2h, respectively. After that, the resist layers 8, 18 are subjected to exposure to light and development treatment to form openings 8a, 18a, respectively, as shown in FIG. 18.

Next, the laminated film 10a as a conductor layer is formed on the metal terminal pad 10 and the via land 34-2l which are exposed to the openings 8a in the resist layer 8, by electroless plating. Similarly, the laminated film 17a as a conductor layer is formed on the metal terminal pad 17 and the via land 34-2l which are exposed to the openings 18a in the resist layer 18, by electroless plating. Subsequently, the solder bumps 11 are formed in the openings 8a so as to be electrically contacted and connected with the metal terminal pads 10 and the via lands 34-2l through the laminated film 10a. As a result, the wiring board 1 as shown in FIG. 1 to FIG. 4 is obtained.

As explained above, in the method of fabricating a wiring board having at least one conductor layer and at least one resin insulating layer by a so-called damascene process, according to the embodiment of the present invention, when a wiring groove is formed in the resin insulating layer and the conductor layer is formed such that at least a portion of the conductor layer serving as a wiring layer is formed in the wiring groove, occurrence of variation in shape and depth of the wiring groove upon processing can be suppressed to thereby prevent occurrence of variation in shape and thickness of the wiring layer to be formed in the wiring groove so that the wiring layer having a design value of impedance can be obtained and the fabricating yield of the wiring board can be enhanced.

The present invention is not limited to the embodiment as explained above and may be variously modified without departing from the scope of the present invention.

Although in the above embodiment, the wiring grooves 6a and the via land grooves 6b are formed after forming the via holes 34-1h as shown in FIG. 8 to FIG. 10, the via holes 34-1h may be formed after forming the wiring grooves 6a and the via land grooves 6b. However, in the latter case, the residue of the respective insulating layers V1, V11 which remains at the bottom of the respective via holes 34-1h upon completion of forming the via holes 34-1h cannot be removed by carrying out surface irradiation with the excimer laser. Accordingly, in this case, water rinsing in desmear process and the following air blowing cannot be omitted to thereby somewhat increase the number of the steps in the fabricating method.

This application is based on prior Japanese Patent Application No. 2010-68104 filed on Mar. 24, 2010 and Japanese Patent Application No. 2010-252691 filed on Nov. 11, 2010. The entire contents of the Japanese Patent Application No. 2010-68104 and the Japanese Patent Application No. 2010-252691 are hereby incorporated by reference.

Further variations of the embodiment and modification as described above will occur to those skilled in the art in light of the above teachings. The scope of the invention is defined with reference to the following claims.

What is claimed is:

1. A method of fabricating a wiring board including at least one conductor layer and at least one resin insulating layer, the method comprising:

a through hole forming step of forming a through hole in said resin insulating layer by irradiating said resin insulating layer with one of a carbon dioxide gas laser and a UV laser;

a wiring groove forming step of forming, after the through hole forming step, a wiring groove in said resin insulating layer by irradiating a surface of said resin insulating layer with a laser, wherein irradiating the surface of said resin insulating layer with the laser removes a residue of said resin insulating layer which remains at a bottom of said through hole;

a via conductor forming step of forming a via conductor in said through hole; and a wiring layer forming step of forming said conductor layer such that at least a portion of said conductor layer is embedded in said wiring groove to form a wiring layer in said wiring groove.

2. The method as claimed in claim 1, wherein in said wiring groove forming step, said surface of said resin insulating layer is irradiated with the laser through a mask formed with an opening which is configured to correspond to a shape of said wiring groove to be formed.

3. The method as claimed in claim 1, wherein said laser is an excimer laser.

4. The method as claimed in claim 1, wherein in said wiring groove forming step, said wiring groove is formed so as not to penetrate said resin insulating layer.

5. The method as claimed in claim 1, wherein said wiring layer forming step and said via conductor forming step are carried out at one time after completion of said wiring groove forming step.

6. The method as claimed in claim 1, wherein in said wiring groove forming step, a via land groove is formed recessed in said surface of said resin insulating layer to communicate with said through hole, and said via land groove and said wiring groove are formed at one time by irradiating said surface of said resin insulating layer with said laser, and in said via conductor forming step, a via land extending from said via conductor is formed.

7. The method as claimed in claim 6, wherein in said wiring groove forming step, said via land groove is formed so as not to penetrate said resin insulating layer.

* * * * *